United States Patent [19]
Hosaka

[11] Patent Number: 5,149,669
[45] Date of Patent: Sep. 22, 1992

[54] METHOD OF FORMING AN ISOLATION REGION IN A SEMICONDUCTOR DEVICE

[75] Inventor: Takashi Hosaka, Tokyo, Japan
[73] Assignee: Seiko Instruments Inc., Japan
[21] Appl. No.: 164,431
[22] Filed: Mar. 4, 1988

[30] Foreign Application Priority Data

Mar. 6, 1987 [JP] Japan .................. 62-51269
Mar. 6, 1987 [JP] Japan .................. 62-51270

[51] Int. Cl.$^5$ .................................. H01L 21/76
[52] U.S. Cl. ............................ 437/72; 437/980
[58] Field of Search .................. 437/62, 69, 72

[56] References Cited

U.S. PATENT DOCUMENTS

| | | | |
|---|---|---|---|
| 4,080,718 | 3/1978 | Richman | 437/69 |
| 4,272,308 | 6/1981 | Varshney | 437/69 |
| 4,292,156 | 9/1981 | Matsumoto et al. | 437/61 |
| 4,508,757 | 4/1985 | Fabricius et al. | 437/69 |
| 4,533,429 | 8/1985 | Josquin | 156/643 |

FOREIGN PATENT DOCUMENTS

| | | | |
|---|---|---|---|
| 0040839 | 3/1983 | Japan | 437/70 |
| 0022342 | 2/1984 | Japan | 437/70 |
| 0239664 | 10/1986 | Japan | 437/61 |

*Primary Examiner*—Mary Wilczewski
*Attorney, Agent, or Firm*—Bruce L. Adams; Van C. Wilks

[57] ABSTRACT

An isolation method which enables bird's beaks to be reduced and which also permits a reduction in the number of defects is disclosed. A masking layer which masks against field oxidation comprises a polycrystalline silicon film covered with silicon nitride films. The surface of the semiconductor substrate which is not masked by the masking layer is subjected to an oxidation treatment to form an element isolation region.

2 Claims, 3 Drawing Sheets

METHOD OF FORMING AN ISOLATION REGION IN A SEMICONDUCTOR DEVICE

BACKGROUND OF THE INVENTION

The present invention relates to a method of isolation of a semiconductor device.

The prior art to which the invention is directed includes the local oxidation of silicon method (hereinafter referred to as LOCOS method). The LOCOS method is a technique such as that described below.

As shown in FIG. 3A, the surface of a semiconductor 31, for example, silicon, is oxidized to form a buffer silicon oxide 32 for reducing stress generated during local oxidation, and further a silicon nitride film 33 which is to be employed as a material for an oxidation mask used in local oxidation is deposited by CVD. Next, as shown in FIG. 3B, a resist 34 is formed in a desired configuration using photoetching method, and with this resist 34 used as a mask, the silicon nitride film 33 is etched. Then, oxidation is carried out. As a result, as shown in FIG. 3C, the region which is covered with no silicon nitride film is oxidized to form a thick oxide film 35 for isolation, whereas the region which is covered with the silicon nitride film 33 is only slightly oxidized. Next, as shown in FIG. 3D, the silicon nitride film and the buffer silicon oxide are successively etched to complete an element isolation region 36 and an active region 37. Thereafter, a semiconductor element is formed in the active region 37.

In the LOCOS method, after the masking layer comprised of silicon nitride is provided on the element region, i.e., active region, the oxidation treatment is carried out, so that a field oxide film which isolates the active region is formed. Accordingly, the field oxide film 35 extends into the active region from the boundary between the element isolation region and active regions in the form of a relatively long and narrow extension (known as "bird's beak") having a length l, resulting in the active region being narrowed, as shown in FIG. 3D). The length l of the bird's beak is usually 0.5 μm or more, although it depends on the oxidation conditions or the like, and the element isolation region may not be narrowed, either. To reduce the bird's beak, it may be effective practice to thin the buffer silicon oxide or thicken the silicon nitride film. However, in either case, a large stress is applied to the semiconductor substrate and a large number of crystal defects are thereby induced therein in the LOCOS process, resulting in deteriorated isolation characteristics. Accordingly, it is impossible with the conventional LOCOS to reduce the above-described bird's beak while maintaining excellent isolation characteristics.

SUMMARY OF THE INVENTION

It is the primary object of the present invention to provide an element isolation method for a semiconductor device by which the above-mentioned defect of the conventional technique is overcome and an isolation with reduced bird's beaks and a reduced number of defects can be provided.

In accordance with the present invention, there is provided an isolation method comprising: (a) forming an insulating film on the surface of a semiconductor substrate, (b) providing a masking layer for preventing oxidation of the underlying semiconductor substrate surface, said masking layer comprising a polycrystalline silicon film covered with a silicon nitride film, (c) subjecting the semiconductor substrate to an oxidation treatment to cause selective oxidation of the semiconductor surface parts not to be masked by the masking layer and (d) forming an element isolation region by removing the masking layer and the insulating film.

BRIEF DESCRIPTION OF THE DRAWINGS

FIGS. 3A to 3D are sectional views showing the procedure of a conventional isolation method.

DESCRIPTION OF THE PREFERRED EMBODIMENTS

Figure 1A:
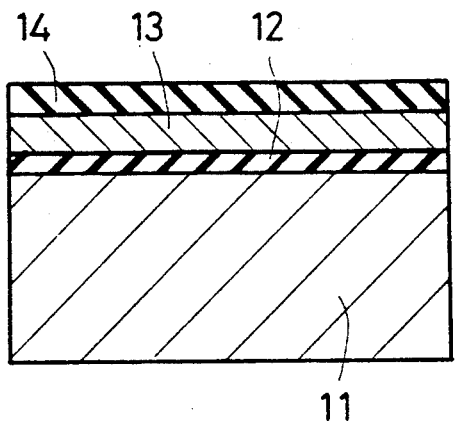
FIGS. 1A to 1F are sectional views showing the procedure of the isolation method according to a first embodiment of the present invention.

According to the present invention, after the masking layer comprised of a polycrystalline silicon film covered with a silicon nitride film is provided on the active region, the oxidation treatment is carried out, so that a field oxide film which isolates the active region is formed. The polycrystalline silicon film has a thermal expansive coefficient equal to that of the silicon substrate and the side wall spacers of the silicon nitride film on the sides of the polycrystalline silicon film are provided. The masking layer for an oxidation mask causes an effective isolation with reduced bird's beaks and a reduced number of defects. Further, the buffer insulating film can be thinned, i.e., from 50 to 500 Å.

In summary, the surface and side surfaces of a polycrystalline silicon film having a thermal expansive coefficient substantially equal to that of a semiconductor substrate e.g., silicon, are covered with silicon nitride films, and with this polycrystalline silicon film used as an masking layer which masks against field oxidation.

The present invention encompasses the following two preferred embodiments.

(1) After a thin oxide film has been formed on the surface of a semiconductor, a polycrystalline silicon film is grown, and a silicon nitride film is then deposited thereon.

Next, the silicon nitride film and the polycrystalline silicon film in a region which is to define an element isolation region are selectively etched. After a silicon nitride film has been deposited, this silicon nitride film is etched using an anisotropic etching process such as reactive dry etching, thereby allowing the silicon nitride films to remain on the upper portion and side walls of the polycrystalline silicon film and completely removing the silicon nitride film in the other region. With the polycrystalline silicon film covered with the silicon nitride films used as a masking layer the region which is covered with no polycrystalline silicon film is oxidized to form an element isolation region. Then, the nitride films and the polycrystalline silicon film which are present in a region which is to define an active region are successively removed.

Thus, an element isolation region which is covered with a thick oxide film and an active region where the semiconductor surface is exposed are formed.

Thereafter, a semiconductor element is formed in the active region.

(2) After a thin oxide film has been formed on the surface of a semiconductor, a polycrystalline silicon film is grown, and a silicon nitride film is then deposited thereon. Next, the silicon nitride film, the polycrystalline silicon film, the silicon oxide film and the semiconductor substrate in a region which is to define an element isolation region are selectively etched. After the exposed semiconductor substrate has been oxidized thinly, a silicon nitride film is deposited and this silicon nitride film is then etched using an anisotropic etching process such as reactive dry etching, thereby allowing the silicon nitride films to remain on the upper portion and side walls of the polycrystalline silicon film and completely removing the silicon nitride film in the other region. With the polycrystalline silicon film covered with the silicon nitride films used as a masking layer the region which is covered with no polycrystalline silicon film is oxidized to form an element isolation region. Then, the nitride films and the polycrystalline silicon film which are present in a region which is to define an active region are successively removed.

Thus, an element isolation region which is covered with a thick oxide film and an active region where the semiconductor surface is exposed are formed. Thereafter, a semiconductor element is formed in the active region.

Examples of the present invention will be described with reference to the accompanying drawings.

EXAMPLE 1

One embodiment of the present invention is shown in FIGS. 1A to 1F. As shown in FIG. 1A, an insulating film, e.g., silicon oxide film 12 is deposited on a semiconductor substrate 11, for example, silicon. The silicon oxide film 12 may be grown by either oxidation or the CVD method.

Next, a polycrystalline silicon film 13 is grown on the silicon oxide film 12 by CVD, as shown in FIG. 1A. Further, a silicon nitride film 14 is deposited on the polycrystalline silicon film 13. The polycrystalline silicon film 13 is formed by chemical vapor deposition using a silane gas ($Si_mH_n$) such as silane gas ($SiH_4$), disilane gas ($Si_2H_6$), trisilane ($Si_3H_8$) or the like.

Figure 1D:
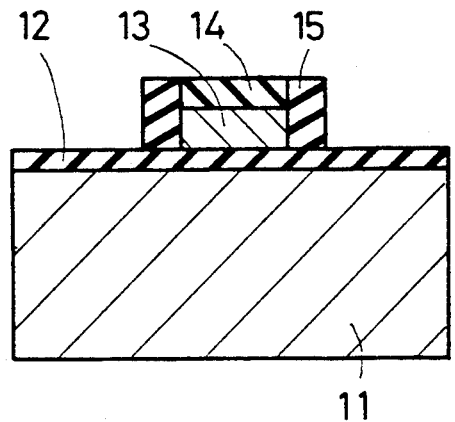
Figure 1B:
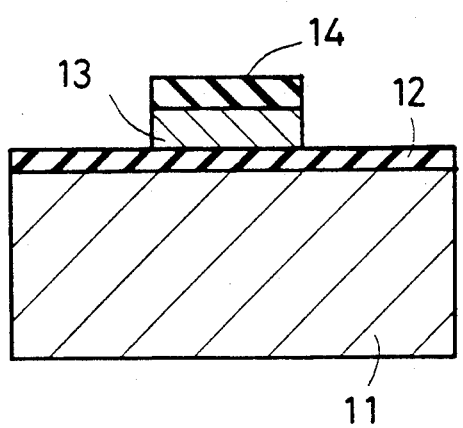
Figure 1E:
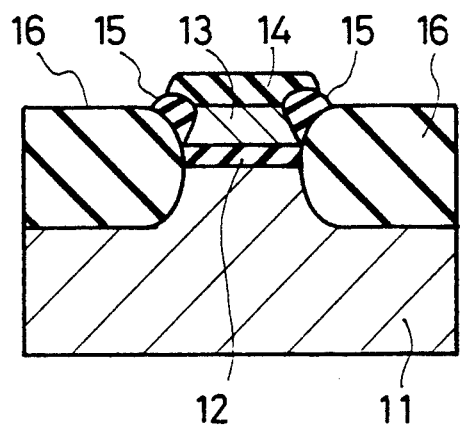
Figure 1C:
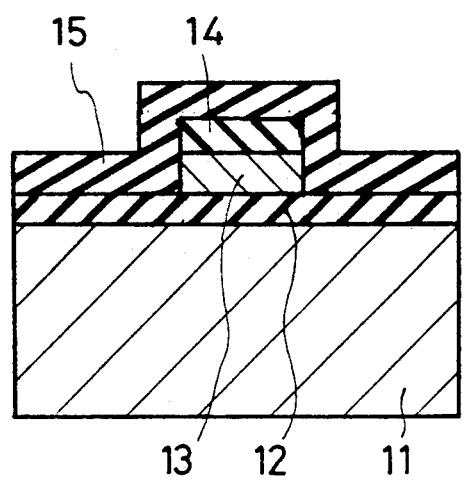
Figure 1F:
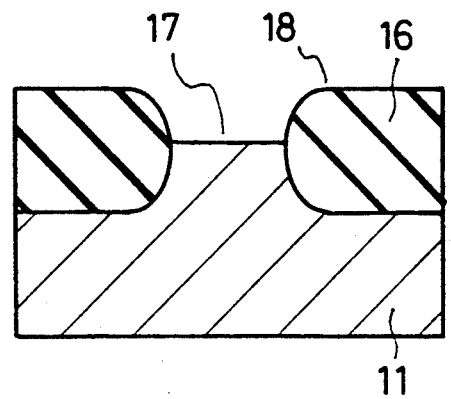

The silicon nitride film 14 is formed by reaction of dichlorosilane gas ($SiH_2Cl_2$) and ammonia ($NH_3$) or the reaction of silane gas ($SiH_4$) and ammonia ($NH_3$). The polycrystalline silicon film 13 and the silicon nitride film 14 may be formed using a method other than the above-described chemical vapor deposition, for example, sputtering. Next, as shown in FIG. 1B, the polycrystalline silicon film 13 and the silicon nitride film 14 are selectively etched using photo-etching or other similar method. More specifically, the silicon nitride film 14 and the polycrystalline silicon film 13 in a region which is to define an element isolation region are removed by etching. This etching may be carried out by a wet process, but it is better to employ a dry process which causes less side etching. Among dry processes, reactive ion etching (generally known as "RIE") and plasma dry etching (generally known as "PPE"), which have strong anisotropy, are particularly preferable. The silicon nitride film 14 and the polycrystalline silicon film 13 may be etched separately using respective etching apparatuses or may be continuously etched using the same etching apparatus. The region where the silicon nitride film 14 and the polycrystalline silicon film 13 are not etched is to define an active region. Next, as shown in FIG. 1C, a second nitride film 15 is deposited. This nitride film 15 may also be formed using chemical vapor deposition, sputtering or the like in the same way as in the case of the nitride film 14. Then, the second nitride film 15 is etched overall using a dry etching process of strong anisotropy (e.g., RIE, PPE, ion milling, sputtering or the like). At this time, it is preferable to completely etch the nitride film on the silicon oxide film 12 in a region which is to define an element isolation region. For this reason, over-etching is carried out. Although the silicon oxide film 12 and the first silicon nitride film 14 are partially etched by the over-etching, there will be no particular problem if the respective thicknesses of the silicon oxide film 12 and the first silicon nitride film 14 are set at appropriate values and the over-etching is not excessively carried out. By the anisotropic etching, the silicon nitride film 15 on the flat portion is completely etched, but the silicon nitride film 15 on the side wall portions of the polycrystalline silicon film 13 is left in the form of side wall spacers 15 as shown in FIG. 1D since the silicon nitride film 15 on the side wall portions is relatively thick. Next, oxidation is carried out in an oxidizing atmosphere. As a result, as shown in FIG. 1E, a thick oxide film 16 is grown in a region other than the region where the polycrystalline silicon film 13 covered with the nitride films is present, while no oxide film is grown in the region where the polycrystalline silicon film covered with the nitride films is present since the nitride films function as an oxidation mask. In particular, the second nitride films 15 which are left as being side wall spacers prevent oxidation in the horizontal direction. Thus, bird's beaks, which are formed by horizontal oxidation, are considerably smaller. Then, the thin oxide film grown on the nitride film during the oxidation, the silicon nitride films 14, 15, the polycrystalline silicon film 13 and the buffer oxide film 12 are successively removed to form an active (element) region 17 and an element isolation region 18, as shown in FIG. 1F. Thereafter, an active element such as a transistor or the like is formed in the active region 17 to produce an IC.

Although not shown in FIG. 1, ion implantation for preventing inversion of the field region may be carried out after the etching of the silicon nitride film 14 and the polycrystalline silicon film 14, or after the deposition of the second silicon nitride film 15, or after the etching of the second silicon nitride film 15.

Since the polycrystalline silicon film has the same composition as that of silicon which serves as the semiconductor substrate, the physical properties of these two materials are similar to each other. Matters which constitute particularly serious problems in local oxidation are thermal strain resulting from the fact that the oxidation mask material and the substrate material differ from each other in terms of thermal expansive coefficient and defects induced in the semiconductor substrate by the thermal strain. The thermal strain is reduced considerably and the number of defects generated in the silicon substrate is also reduced considerably by employing polycrystalline silicon as an oxidation mask material and covering the surface and side walls of this polycrystalline silicon with silicon nitride films. Accordingly, bird's beaks can be reduced considerably by virtue of the facts that the buffer silicon oxide can be thinned and that horizontal oxidation is prevented by the side wall nitride films. Although the buffer silicon oxide 12 formed in accordance with the conventional LOCOS method is from 500 to 1000 Å, it can be reduced to from 30 to 500 Å by the use of the oxidation mask according to the present invention. Further, the thickness of the polycrystalline silicon film 13 is preferably set at from 300 to 6000 Å for practical use, although the thicker the film 13 the smaller the bird's beaks. The silicon nitride film 14 is only required to have a thickness which is sufficient for the nitride film 14 to remain adequately after the silicon nitride film 15 has been over-etched and which is sufficient to prevent the polycrystalline silicon film 12 from being oxidized during field oxidation. Further, the thicker the silicon nitride film 15, the thicker the side wall spacers and the smaller the bird's beaks. However, it is preferable to set the thickness of the silicon nitride film 15 at from 300 to 3000 Å for practical use. When the thicknesses of the buffer silicon oxide 12, the polycrystalline silicon film 13, the silicon nitride film 14 and the silicon nitride film 15 are 200 Å, 4000 Å, 1500 Å and 1500 Å, respectively, and the silicon oxide film 16 was grown to a thickness of 60000 Å, the length of the bird's beak was 0.2 μm or less, and therefore it was possible to form active and element isolation regions having dimensions which are substantially equal to the respective pattern dimensions. Further, the defect density at this time is considerably small, and excellent isolation characteristics are exhibited.

EXAMPLE 2

Another embodiment of the present invention is shown in FIGS. 2A to 2H.

Figure 2A:
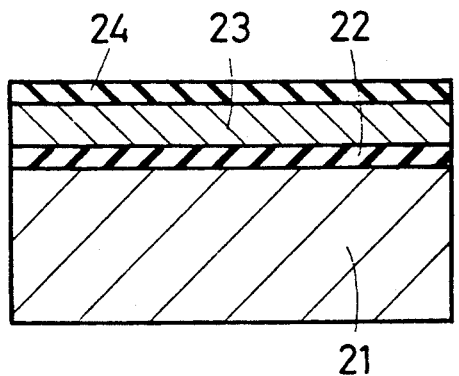
FIGS. 2A to 2H are sectional views showing the procedure of the isolation method according to a second embodiment of the present invention.
Figure 2B:
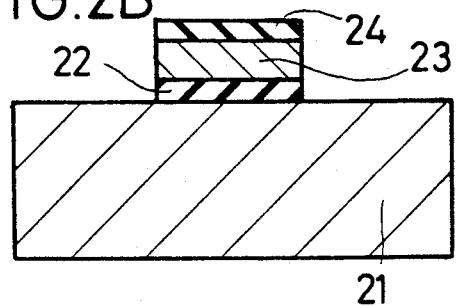
Figure 2C:
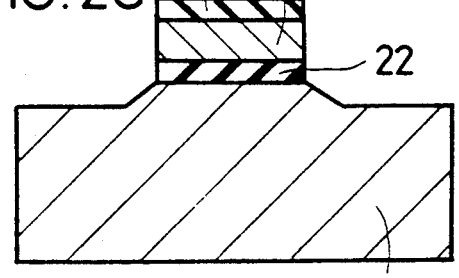

As shown in FIG. 2A, an insulating film 22 is deposited on a semiconductor substrate 21, for example, silicon (Si). The semiconductor substrate 21 may, of course, be a semiconductor other than silicon. For example, the semiconductor substrate 21 may be a compound semiconductor such as gallium arsenide (GaAs) or phosphorus indate (InP). The insulating film 22 is generally a silicon oxide film which may be grown by either oxidation, chemical vapor deposition (CVD) or physical vapor deposition (PVD). The insulating film 22 is also known as the buffer (pad) oxide film which functions to reduce the stress induced in the semiconductor substrate during field oxidation carried out in a subsequent step. In the LOCOS method, the thicker the insulating film 22, the longer the bird's beak Conversely, the thinner the insulating film 22, the shorter the bird's beak and, on the other hand, the higher the defect density in the semiconductor substrate. Next, a polycrystalline silicon film 23 is grown on the insulating film 22. Further, a silicon nitride film 24 is deposited on the polycrystalline silicon film 23. The polycrystalline silicon film 23 may be deposited by either CVD or PVD. In the case of CVD, the polycrystalline silicon film 23 is formed by chemical vapor deposition using a silane gas ($Si_mH_n$), such as silane gas ($SiH_4$), disilane gas ($Si_2H_6$), trisilane ($Si_3H_8$) or the like. The silicon nitride film 24 may also be deposited by either CVD or PVD. In the case of CVD, the silicon nitride film 24 is formed by the reaction of dichlorosilane gas ($SiH_2Cl_2$) and ammonia gas ($NH_3$) or the reaction of silane gas ($SiH_4$) and ammonia gas ($NH_3$). Next, as shown in FIG. 2B, the silicon nitride film 24, the polycrystalline silicon film 23 and the silicon oxide film 22 are selectively etched using photoetching or other similar method. More specifically, the silicon nitride film 24, the polycrystalline silicon film 23 and the silicon oxide film 22 in a region which is to define an element isolation region are removed by etching. This etching may be carried out by a wet process, but it is better to employ a dry process which causes less side etching. Among dry processes, reactive ion etching (generally known as "RIE"), and plasma dry etching (generally known as "PPE"), which have strong anisotropy, are particularly preferable. In order to form a small pattern, i.e., 3 microns or less, the anisotropic etching is preferable. Since the silicon oxide film 22 is generally thin, i.e., 500 Å or less, there will be no particular problem even if the etching is carried out by a wet process. The silicon nitride film 24, the polycrystalline silicon film 23 and the silicon oxide film 22 may be etched separately using respective etching apparatuses or may be continuously etched using the same etching apparatus. The region where the silicon nitride film 24 and the polycrystalline silicon film 23 are not etched is to define an active region. Next, as shown in FIG. 2C, the exposed semiconductor substrate 21 from which the thin films such as the silicon nitride film 24 have been removed is etched. This etching of the semiconductor substrate is carried out for the purpose of reducing the level difference between active and element isolation regions produced after local oxidation, of minimizing bird's beaks and of reducing the number of defects in the semiconductor substrate. In the etching of the semiconductor substrate 21, a masking material such as a photoresist may, of course, be present on the silicon nitride film 24 in the region which is to define an active region. However, in the case where a heat-treating step such as oxidation is carried out between the steps shown in FIG. 2B and 2C, the masking material such as a photoresist must be removed. The etching of semiconductor substrate shown in FIG. 2C may be carried out by either a wet or dry process. In the case of a wet process, it is preferable to employ an etching liquid which etches the semiconductor substrate, for example, silicon, in an anisotropic manner. For example, anisotropic etching can be effected using an alkali liquid such as potassium hydroxide.

Figure 2D:
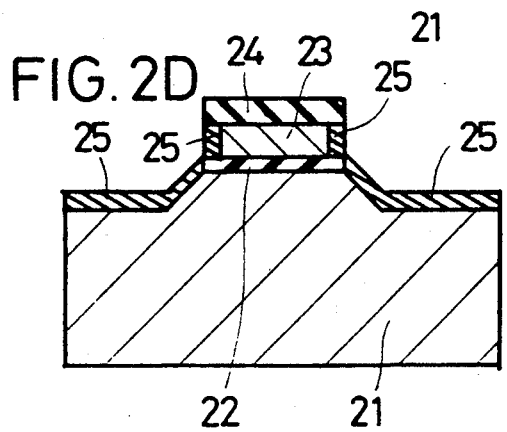

In the case of a dry process, it is preferable to employ RIE or PPE, which particularly enables anisotropic etching. The extent to which the semiconductor substrate 21, for example, silicon, is etched is selected so that active and element isolation regions which are completed when local oxidation is carried out are flush with each other. For example, in the case where the semiconductor substrate 21 is silicon, if the thickness of the field oxide film in the element isolation region is 6000 Å, the silicon substrate is etched to about 3000 Å. Next, as shown in FIG. 2D, oxidation is carried out in an oxidizing atmosphere to oxide lightly both the semiconductor substrate 21 and the polycrystalline silicon 23. The silicon oxide film 25 is provided in order to reduce defects and stress induced in the semiconductor substrate 21 and also to serve as an etching stopper which is used at the time of full-scale etching of a silicon nitride film carried out subsequently. The thinner the silicon oxide film 25, the smaller the bird's beak and, on the other hand, the larger the number of defects in the semiconductor substrate 21. Therefore, the thickness of the silicon oxide film 25 is preferably from 50 to 1000 Å. At the time of this oxidation, the silicon nitride film 24 is also oxidized slightly. In the case where the presence of defects in the semiconductor substrate gives rise to no serious problem, the silicon oxide film 25 may be thinner than the above-described value, or oxidation may be omitted.

Figure 2E:
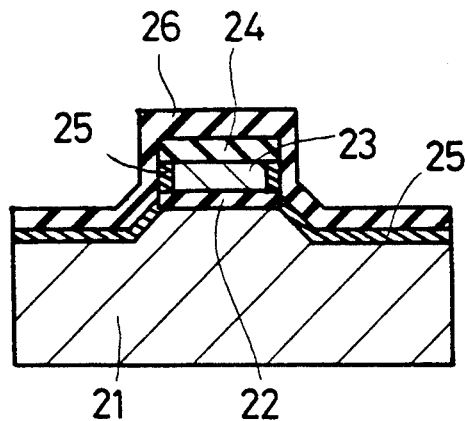

Next, as shown in FIG. 2E, a second nitride film 26 is deposited. This nitride film 26 may also be formed using CVD, PVD or the like in the same way as in the case of the nitride film 24. Then, the second nitride film 26 is etched overall using a dry etching process of strong anisotropy (e.g., RIE, PPE, ion milling, sputtering or the like). At this time, it is preferable to completely etch the nitride film on the silicon oxide film 25 in a region which is to define an element isolation region. For this reason, over-etching is carried out. Although the silicon oxide film 25 and the first silicon nitride film 24 are partially etched by the over-etching, there will be no particular problem if the respective thicknesses of the silicon oxide film 25 and the first silicon nitride film 24 are set at appropriate values and the over-etching is not excessively carried out.

Figure 2F:
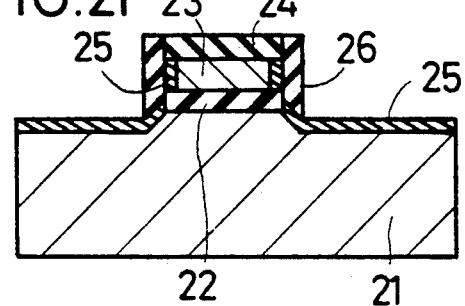

By the anisotropic etching, the silicon nitride film 26 on the flat portion is completely etched, but the silicon nitride film 26 on the side wall portions of the polycrystalline silicon film 23 is left in the form of side wall spacer 26 as shown in FIG. 2F since the silicon nitride film on the side wall portions is relatively thick.

Figure 2G:
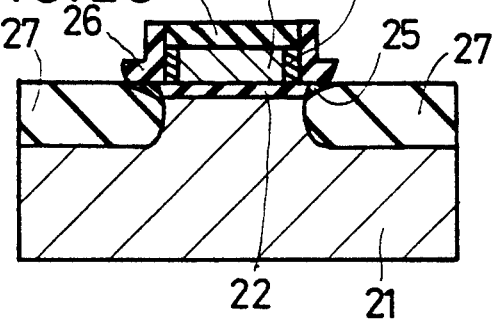
Figure 2H:
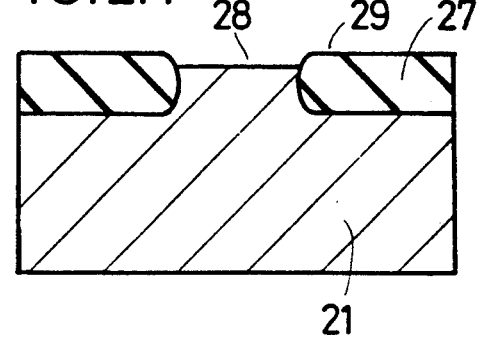
Figure 3A:
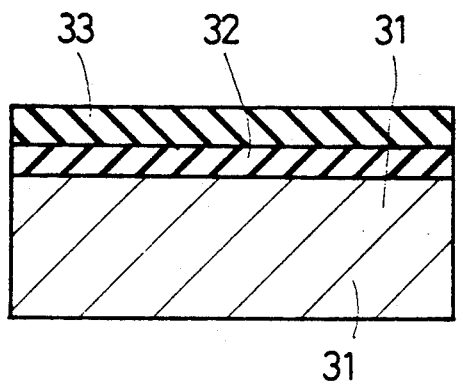
Figure 3B:
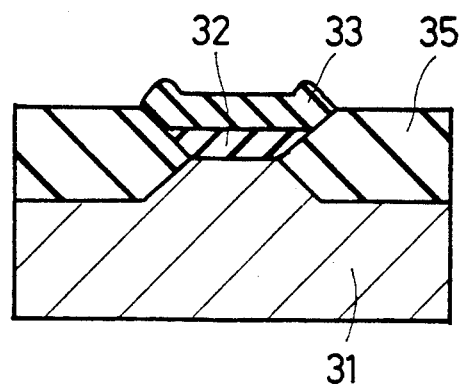
Figure 3B:
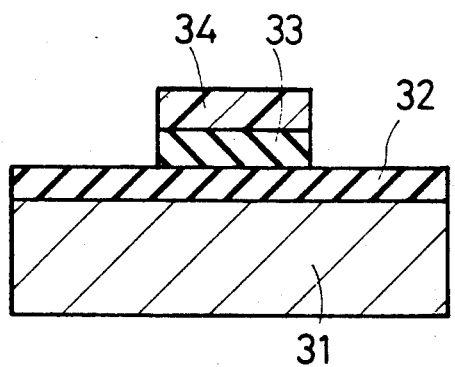
Figure 3D:
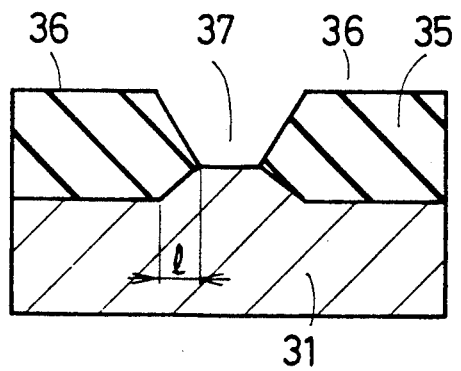

Next, oxidation is carried out in an oxidizing atmosphere. As a result, as shown in FIG. 2G, an oxide film 27 is grown in a region other than the region where the polycrystalline silicon film 23 covered with the nitride films is present while no oxide film is grown in the region where the polycrystalline silicon film covered with the nitride films is present since the nitride films function as an oxidation mask. In particular, the second nitride films 26 which are left as being side wall spacer prevent oxidation in the horizontal direction. Thus, bird's beaks, which are formed by horizontal oxidation, are considerably smaller. Then, the thin oxide film grown on the nitride film during the oxidation, the silicon nitride films 26, 24, the polycrystalline silicon film 23 and the buffer oxide film 22 are successively removed to form an active (element) region 28 and an element isolation region 29, as shown in FIG. 2H. Thereafter, an active element such as a transistor or the like is formed in the active region 28 to produce an IC.

Although not shown in FIG. 2, ion implantation for preventing inversion of the field region may be carried out after any one of the steps respectively shown in FIGS. 2C, 2D, 2E and 2F.

When the thicknesses of the buffer silicon oxide 22, the polycrystalline silicon film 23, the silicon nitride film 24 and the silicon nitride film 26 are 200 Å, 4000 Å, 1500 Å and 1500 Å, respectively, and the etching of silicon was carried out to 3000 Å by KOH and further the thickness of the silicon oxide film 25 is 500 Å, the field oxide film 27 was grown to a thickness of 6000 Å, the length of the bird's beak was 0.2 μm or less, and therefore it was possible to form active and element isolation regions having dimensions which are substantially equal to the respective pattern dimensions. The level difference between the active and element isolation regions was 500 Å or less. Thus, it is also possible to obtain excellent evenness.

According to the present embodiment, it is possible to reduce the level difference between the active and element isolation regions, since the semiconductor substrate is etched a certain extent prior to the local oxidation.

What is claimed is:

1. A method of manufacturing a semiconductor device comprising the steps of:
   forming an insulating film on a surface of a semiconductor substrate;
   providing a masking layer for preventing oxidation of the underlying semiconductor substrate surface, said masking layer comprising a polycrystalline silicon film directly disposed on the insulating film and a silicon nitride film covering upper and side walls of the polycrystalline silicon film, the masking layer being formed by
   forming the polycrystalline silicon film on the insulating film,
   forming a first silicon nitride film on the polycrystalline silicon film,
   successively subjecting the first silicon nitride film, the polycrystalline silicon film and the semiconductor substrate to selective etching,
   oxidizing the semiconductor substrate to form an oxide film on the sides of the polycrystalline silicon film and the surface of the semiconductor substrate,
   depositing a second silicon nitride film on the surface of the exposed portion of the semiconductor substrate, and
   subjecting the second silicon nitride film to anisotropic etching to form side wall spacers of the second silicon nitride film on the sides of the polycrystalline silicon film;
   subjecting the semiconductor substrate to an oxidation treatment to form an oxide film by selective oxidation of the semiconductor surface parts not masked by the masking layer; and
   forming an element isolation region defined by the oxide film by removing the masking layer and the insulating film;
   wherein the extent to which the semiconductor substrate is etched during formation of the masking layer is from 0.4 to 0.6 of the thickness of the oxide film which defines the element isolation region.

2. A method of manufacturing a semiconductor device comprising the steps of:
   providing a silicon semiconductor substrate;
   forming an insulating film on a surface of the substrate;
   disposing a polycrystalline silicon film directly on a portion of the insulating film and disposing a silicon nitride film covering an upper surface and side walls of the polycrystalline silicon film to mask the substrate surface thereunder during oxidation, the mask being formed by
   forming the polycrystalline silicon film on the insulating film,
   forming a first silicon nitride film on the polycrystalline silicon film,
   successively subjecting the first silicon nitride film, the polycrystalline silicon film and the semiconductor substrate to selective etching,
   oxidizing the semiconductor substrate to form an oxide film on the sides of the polycrystalline silicon film and the surface of the semiconductor substrate,
   depositing a second silicon nitride film on the surface of the exposed portion of the semiconductor substrate, and
   subjecting the second silicon nitride film to an anisotropic etching to form side wall spacers of the second silicon nitride film on the sides of the polycrystalline silicon film;
   oxidizing the semiconductor substrate by an oxidation treatment to selectively oxidize portions of the unmasked substrate surface; and
   forming an element isolation region defined by one of the oxidized portions by removing the mask and the insulating film;
   wherein the extent to which the semiconductor substrate is etched during formation of the mask is from 0.4 to 0.6 of the thickness of the oxidized portion which defines the element isolation region.

* * * * *